United States Patent [19]
Holmes et al.

[11] Patent Number: 5,461,774
[45] Date of Patent: Oct. 31, 1995

[54] APPARATUS AND METHOD OF ELASTICALLY BOWING A BASE PLATE

[75] Inventors: Jeffrey G. Holmes; Andrew C. McNeil, both of Scottsdale, Ariz.

[73] Assignee: Motorola, Inc., Schaumburg, Ill.

[21] Appl. No.: 217,831

[22] Filed: Mar. 25, 1994

[51] Int. Cl.$^6$ .............................. H01R 43/16; H01B 7/34
[52] U.S. Cl. .................. 29/840; 29/446; 29/449; 29/525.1; 174/16.3; 439/83
[58] Field of Search ................... 439/83; 29/840, 29/884, 446, 449, 525.1; 174/16.3

[56] References Cited

U.S. PATENT DOCUMENTS

| | | | |
|---|---|---|---|
| 4,654,966 | 4/1987 | Kohara et al. | 29/840 |
| 4,853,828 | 8/1989 | Penn | 174/16.3 X |
| 5,036,584 | 8/1991 | Beauregard et al. | 29/884 |
| 5,146,981 | 9/1992 | Samarov | 174/16.3 X |

FOREIGN PATENT DOCUMENTS

| 2-143583 | 6/1990 | Japan | 439/83 |
|---|---|---|---|

*Primary Examiner*—Carl J. Arbes
*Attorney, Agent, or Firm*—Robert D. Atkins

[57] ABSTRACT

An electronic module assembly (10) is constructed by attaching semiconductor die (20, 22) to corresponding ceramic substrates (16, 18). A solder preform (14) is placed between the ceramic substrates and a base plate (12) which in turn is placed on a mounting fixture (26). Steel shims (28–42) are placed around the perimeter between the base plate and the mounting fixture surface. A restraining mechanism (24) passes through the center of the base plate and fastens to the mounting fixture to create a force on the base plate causing it to bow in an elastic manner. The assembly is reflow soldered and cooled with the module assembly restrained in the pre-bow apparatus. The elastic bow compensates for differences in thermal expansion and contraction characteristics between the ceramic substrates and base plate encountered during the reflow and later processes to prevent stresses from developing on the solder bond between materials.

19 Claims, 2 Drawing Sheets

APPARATUS AND METHOD OF ELASTICALLY BOWING A BASE PLATE

BACKGROUND OF THE INVENTION

The present invention relates in general to the manufacture of electronic power module packages and, more particularly, to the bonding of materials having dissimilar coefficients of thermal expansion in the manufacturing process of the module package.

Electronic power modules incorporating power levels of 200 watts and more are used extensively in transportation, computer, HVAC, and other industry applications. These modules are popular due to their small feature size and comparative low cost. For additional cost reduction purposes, there is a demand to further increase the level of electronic integration within the module to provide increased functionality while maintaining the small feature size of the package. As a result of the increased functionality, the power dissipation and heat generation per unit area of the module increases.

In the past the module has been fabricated by attaching semiconductor die to one or more ceramic substrates and further bonding the resulting assembly to a copper base plate that serves as a combinational mechanical base and heat sink. The ceramic substrate is typically soldered to the base plate.

During manufacture of the module, the ceramic substrate and copper base plate assembly is heated to a temperature that assures the solder will bond adequately to both materials. When the assembly cools a stress develops along the solder bond because of the dissimilar thermal characteristics of the ceramic and copper materials causing the materials to expand and contract by different amounts. The stress exerted by the bonded materials may cause cracking or other failure of the solder bond and create hot spots in the module upon application of electrical power. Consequently, premature electrical failure of the module may occur.

Attempts have been made to solve the problem by plastically preforming the base plate so as to match the thermal expansion and contraction of the ceramic substrate. The copper base plate is bent typically at room temperature with an external force beyond its elastic range to create a permanent bow in the material. Unfortunately, it is difficult to precise and consistently bend the copper base plate beyond its elastic range so that when the external force is removed, the base plate retains the proper bow that will match the thermal expansion characteristics of the ceramic substrate.

The plastic pre-bow curvature is difficult to control because the shape of the curve depends on the plastic properties of the copper base plate and is inherently sensitive to variations in raw material properties. Moreover, each application typically requires its own, often expensive, stamping tool to achieve a specific pre-bow. Thus, variations in module base plate size, thickness, plasticity, and cooling techniques make it difficult to achieve the proper plastic bow in the base plate that matches the thermal expansion of the ceramic substrate.

Hence, a need exists for a module fabrication method that compensates for materials having dissimilar thermal expansion characteristics.

DETAILED DESCRIPTION OF THE PREFERRED EMBODIMENT

Figure 1:
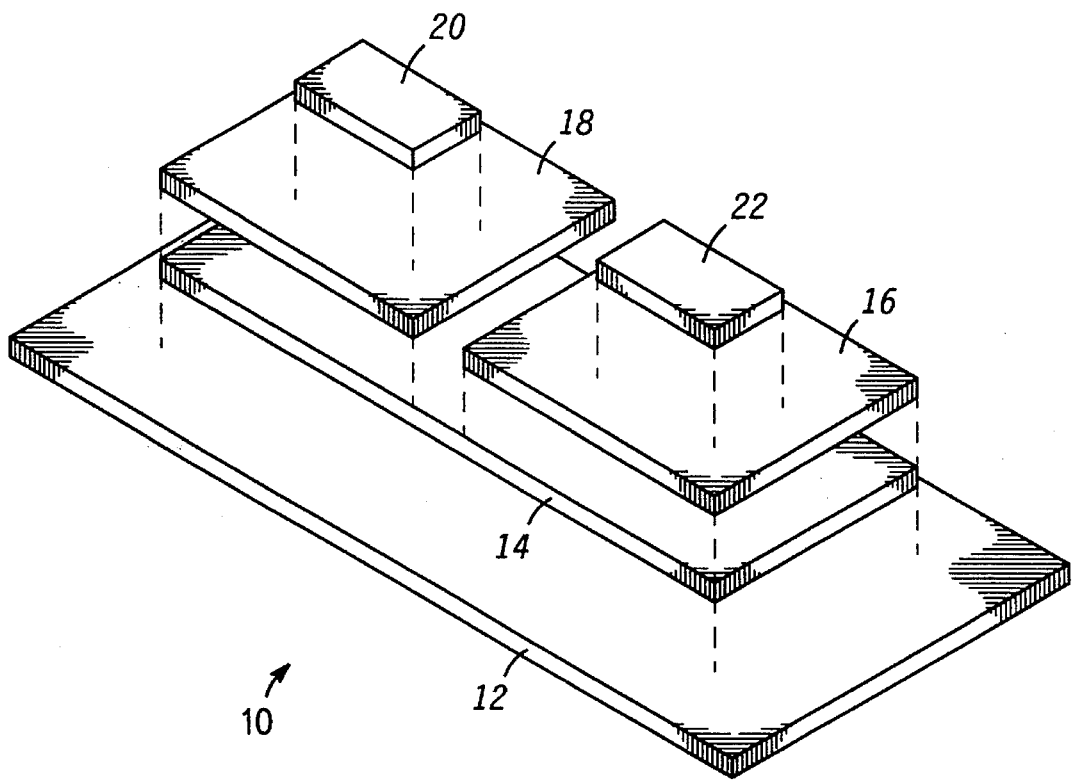
FIG. 1 illustrates an exploded view of an electronic module assembly.

Referring to FIG. 1, in the construction of electronic power module assembly 10, a solder preform 14 is disposed on a flat copper base plate 12. Solder preform 14 comprises a 60/40 ratio of Pb/Sn. Base plate 12 has dimensions of 2.5 inches wide by 3.5 inches long and 125 mils thick and provides a semi-rigid, heat spreading mounting surface for the power module assembly. Semiconductor die 20 and 22 are mounted to ceramic substrates 18 and 16, respectively, using standard solder die attach techniques with a high melting point that will not reflow in subsequent manufacturing steps. Substrates 16 and 18 are fabricated from a 25 mil thick aluminum oxide material and provide both a mounting platform and an electrically insulating layer between semiconductor die 20 and 22 and base plate 12. Silicon carbide substrates and conductive substrates such as molybdenum may also be used. Semiconductor die 20 and 22 are typically silicon or gallium arsenide materials. The completed die/substrate assembly is then placed on the solder preform and base plate.

Figure 2:
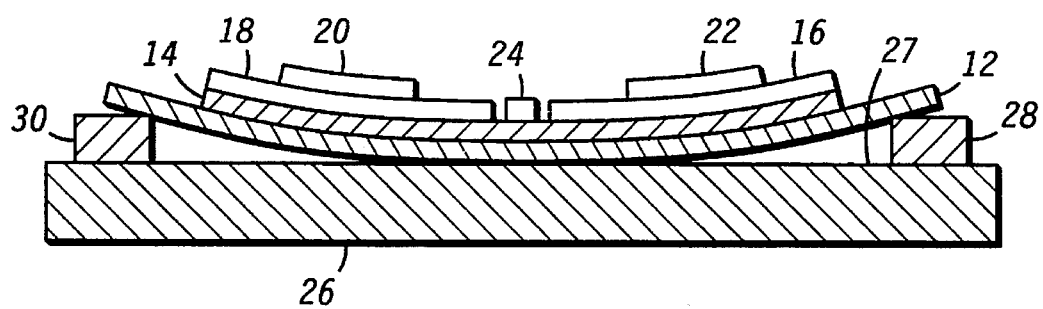
FIG. 2 illustrates a side view of the electronic module with the base plate elastically pre-bowed.
Figure 3:
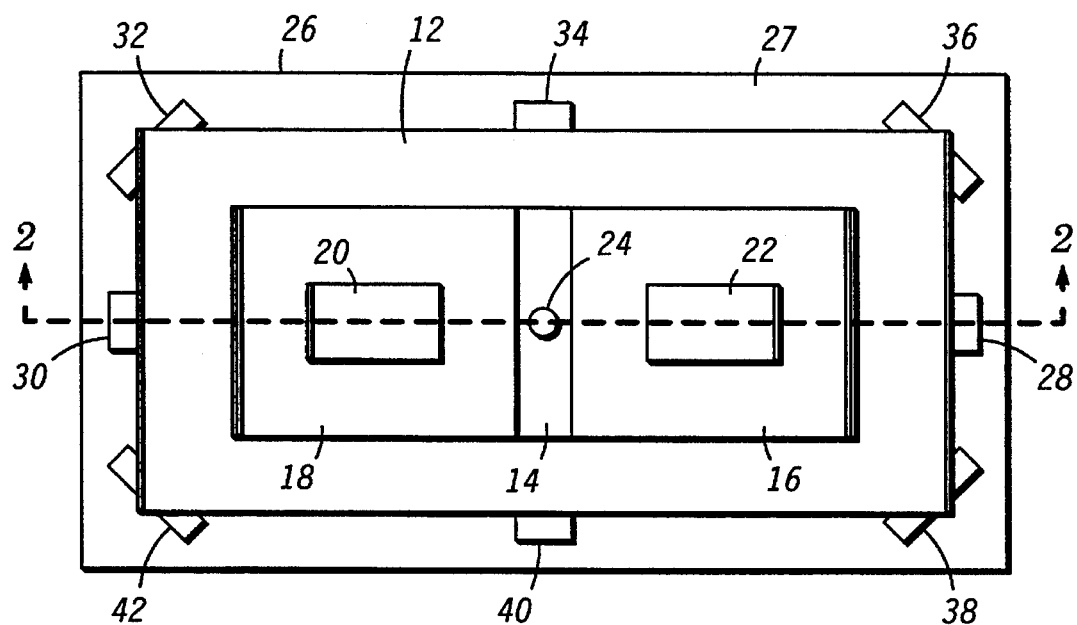
FIG. 3 illustrates a top view showing placement of the shims to elastically pre-bow the base plate.

In FIG. 2, a cross-section of the power module assembly is shown. The assembly comprising base plate 12 and solder preform 14 with semiconductor die 20 and 22 and substrates 18 and 16 is placed on fixture surface 27 of mounting fixture 26. Mounting fixture 26 is made from 1.0 inch thick carbon steel of sufficient rigidity so as not to deform when base plate 12 is bent within its elastic range. Other materials possessing similar rigid characteristics may also be used for mounting fixture 26. Steel shims 28, 30, 32, 34, 36, 38, 40, and 42 are inserted around the perimeter area of base plate 12 in a symmetrical fashion between base plate 12 and mounting surface 27 of mounting fixture 26, as shown in FIG. 3. Steel shims 32, 36, 38, and 42 may be placed at each corner of copper base plate 12 to produce the desired deformation of base plate 12. Although eight symmetrically placed shims are shown in this embodiment, the number of shims may be varied to produce the desired elastic pre-bowed characteristics of base plate 12.

A restraining mechanism 24, for example a steel bolt, is passed through a hole or opening near the center region of preform 14 and base plate 12 and fastened to mounting fixture 26. The resulting forces applied by restraining mechanism 24 and shims 28–42 causes base plate 12 to deform in a bowed elastic manner. An elastic bow is one that does not permanently change the shape of the base plate material. That is, once the external force is removed, i.e. restraining bolt 24 and shims 28–42, the base plate returns to its original flat form. The thickness of shims 28–42 is one factor in determining the amount of deformation in the elastic range of base plate 12.

In the prior art, the base plate was bent beyond its elastic range to create a permanent bow in the material. After the base plate is bent, the external forces are removed and the base plate assumed some permanent bowed configuration dependent on the material and the amount of plastic pre-bow. The permanently bowed configuration is always somewhat less than the degree of plastic pre-bow thus accounting for the uncertainty. No external forces are applied to the base plate during reflow when the ceramic substrate is bonded to the bowed base plate. Thus, it is difficult to precise and consistently bend the base plate beyond its elastic range so that it retains the proper bow that will match the thermal expansion of the ceramic substrate during the heating and cooling reflow process.

In contrast, the present invention involves bending the base plate within its elastic range in a direction opposite to the anticipated resultant distortion between bonded materials having thermally dissimilar characteristics such that once the external force is removed, the base plate returns to its original flat form. Module assembly 10 remains in the pre-bow apparatus with the restraining bolt and shims holding base plate 12 in its elastic bow during the reflow of preform solder 14 when ceramic substrates 16–18 are bonded to base plate 12. By properly selecting the elastic pre-bow to match the thermal expansion and contraction behavior of ceramic substrates 16–18, substantially no stress occurs on the solder bond after cooling when the pre-bow is released.

The proper amount of elastic deformation of base plate 12 is determined by experimentation and/or computer simulation. The required pre-bow elastic curvature of base plate 12 is directly related to the thermal characteristics of ceramic substrates 16 and 18 and the amount of thermal distortion counteracted in the assembly process. The thermal distortion depends on several factors such as the difference in coefficients of thermal expansion between base plate 12 and ceramic isolation layers 16 and 18, the difference in temperature between ambient and solder melting points, and the size of the parts to be assembled.

For the present embodiment, the difference in the coefficient of thermal expansion is approximately 11 ppm/°C. (17.6 ppm/°C. for copper, 7 ppm/°C. for aluminum oxide), and the difference in temperature is about 160° C. (ambient temperature is 25° C. while the 60/40 Pb/Sn solder preform 14 melts at 185° C. ). Shims 28–42 are selected with dimensions 0.3 inches wide by 1.0 inch long and 7 mils thick. With base plate 12 having 2.5 inches wide by 3.5 inches long and 125 mils thick dimensions, it was found that the copper material bowed elastically 20 mils at the edges from its flat state before reaching its plastic state. Other size shims may be used to achieve other degrees of elastic pre-bowing as needed. The size of mounting fixture 26 may also be varied to accommodate various module sizes.

The completed module assembly stack when restraining mechanism 24 and shims 28–42 in place is passed through a hydrogen furnace for approximately one hour. The temperature of the hydrogen furnace is generally set at 210° C. to assure that the melting point of solder preform 14 (185° C. ) is surpassed. The heat from the furnace causes solder preform 14 to reflow. Module assembly 10 is cooled to complete the bonding operation. Restraining mechanism 24 is released and the bonded module components are removed from mounting fixture 26. Base plate 12 relaxes to its steady-state position with substantially no stress on the solder bond between the base plate and ceramic substrate.

A silicon gel coat (not shown) is typically applied to and overflows the surfaces of semiconductor die 20 and 22 to provide protection from the environment surrounding the semiconductor die. A cover is placed over the completed module assembly and affixed using common package sealing techniques. The cover and the silicon gel coat do not affect any curvature remaining in base plate 12.

By now it should be appreciated that the present invention provides an apparatus and method for joining and bonding thermally dissimilar materials in an electronic module package assembly process while avoiding thermal distortion between the joined materials. Using a shim and restraining technique, the module assembly is pre-bowed in an elastic manner and in a direction opposite to the anticipated resultant distortion between bonded materials having thermally dissimilar characteristics. The amount and shape of bending can be easily adjusted to accommodate various module sizes and materials. The assembly is reflowed with the base plate elastically bowed in the pre-bow apparatus. After cooling, the assembly is removed from the pre-bow apparatus the base plate relaxes to its steady-state position with substantially no stress on the solder bond between the base plate and ceramic substrate. The elastic bow compensates for differences in thermal expansion and contraction characteristics between the ceramic substrates and base plate encountered during the reflow and later processes to prevent stresses from developing on the solder bond between materials. The aforedescribed elastic bowing apparatus and methods are adaptable to different base plate sizes and different manufacturing process thermal situations. The cost of adaptation is inexpensive and consists of changing shim sizes and placements about the base plate and adjusting the restraining mechanism to provide the optimum the base plate elastic pre-bow characteristics.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. An apparatus for bonding thermally dissimilar materials, comprising:

a mounting surface;

a base plate having a perimeter area;

a plurality of shims placed between said base plate and said mounting surface; and a restraining mechanism holding said base plate against said mounting surface to elastically bow said base plate.

2. The apparatus of claim 1 wherein said plurality of shims are placed around said perimeter area of said base plate.

3. The apparatus of claim 2 wherein said restraining mechanism includes a bolt attached through an opening in a center region said base plate to said mounting surface.

4. The apparatus of claim 3 wherein said base plate is made of copper.

5. The apparatus of claim 4 wherein said plurality of shims are made of steel.

6. The apparatus of claim 5 further including:

a solder preform disposed on said base plate;

an insulating layer disposed on said solder preform to bond to said base plate upon reflow; and a semiconductor die bonded to said insulating layer.

7. The apparatus of claim 6 wherein said insulating layer is ceramic.

8. A method of bonding thermally dissimilar materials, comprising the steps of:

placing a plurality of shims between a base plate and a mounting surface; and restraining said base plate against said mounting surface to elastically bow said base plate.

9. The method of claim 8 wherein said plurality of shims are placed around a perimeter area of said base plate.

10. The method of claim 9 wherein said step of restraining includes the step of attaching a bolt through an opening in a center region said base plate to said mounting surface.

11. The method of claim 10 wherein said base plate is made of copper.

12. The method of claim 11 wherein said plurality of shims are made of steel.

13. The method of claim 12 further including the steps of:
 disposing a solder preform on said base plate;
 disposing an insulating layer on said solder preform;
 bonding a semiconductor die to said insulating layer; and
 bonding said isolation layer to said base plate by a reflow process.

14. The method of claim 13 wherein said insulating layer is ceramic.

15. A method of bonding thermally dissimilar materials, comprising the steps of:
 disposing a solder preform on a base plate;
 disposing an insulating layer on said solder preform;
 bonding a semiconductor die to said insulating layer;
 placing a plurality of shims between said base plate and a mounting surface around a perimeter area of said base plate;
 restraining said base plate against said mounting surface to elastically bow said base plate; and
 bonding said isolation layer to said base plate by a reflow process.

16. The method of claim 15 wherein said step of restraining includes the step of attaching a bolt through an opening in a center region said base plate to said mounting surface.

17. The method of claim 16 wherein said base plate is made of copper.

18. The method of claim 17 wherein said plurality of shims are made of steel.

19. The method of claim 18 wherein said insulating layer is ceramic.

\* \* \* \* \*